(12) United States Patent
Zou et al.

(10) Patent No.: US 9,866,971 B2
(45) Date of Patent: Jan. 9, 2018

(54) METHOD FOR MANUFACTURING THERMAL BIMORPH DIAPHRAGM AND MEMS SPEAKER WITH THERMAL BIMORPHS

(71) Applicant: GOERTEK INC., WeiFang (CN)

(72) Inventors: Quanbo Zou, WeiFang (CN); Zhe Wang, WeiFang (CN); Jifang Tao, WeiFang (CN); Guanxun Qiu, WeiFang (CN)

(73) Assignee: GOERTEK INC., WeiFang (CN)

( * ) Notice: Subject to any disclaimer, the term of this patent is extended or adjusted under 35 U.S.C. 154(b) by 0 days.

(21) Appl. No.: 15/305,089

(22) PCT Filed: Aug. 26, 2014

(86) PCT No.: PCT/CN2014/085204
§ 371 (c)(1),
(2) Date: Oct. 18, 2016

(87) PCT Pub. No.: WO2016/029357
PCT Pub. Date: Mar. 3, 2016

(65) Prior Publication Data
US 2017/0041719 A1   Feb. 9, 2017

(51) Int. Cl.
*H04R 25/00* (2006.01)
*H04R 19/02* (2006.01)
(Continued)

(52) U.S. Cl.
CPC ............. *H04R 19/02* (2013.01); *B81B 7/008* (2013.01); *B81C 1/00158* (2013.01); *H04R 7/06* (2013.01);
(Continued)

(58) Field of Classification Search
CPC ...... B81B 2201/032; B81B 2201/0257; B81B 2203/0127; B81B 2207/012;
(Continued)

(56) References Cited

U.S. PATENT DOCUMENTS

2003/0223613 A1   12/2003  Hachiya
2007/0245542 A1*  10/2007  Horng ................. H04R 19/005
                                                 29/594
(Continued)

FOREIGN PATENT DOCUMENTS

CN        1571582 A    1/2005
CN      103686548 A    3/2014
EP      1 931 173 A2   6/2008

OTHER PUBLICATIONS

International Search Report for International Patent Application No. PCT/CN2014/085204 filed on Aug. 26, 2014.

*Primary Examiner* — Brian Ensey

(57) ABSTRACT

The present invention provides a method for manufacturing a thermal bimorph diaphragm and a MEMS speaker with thermal bimorphs, wherein the method comprises the steps of: thermally oxidizing a substrate to obtain an insulating layer thereon and providing a metal layer on the insulating layer; providing a sacrificial layer on the metal layer; providing a first thermal bimorph layer on the sacrificial layer; providing a second thermal bimorph layer on the first thermal bimorph layer; providing a metal connecting layer at the positions on the metal layer where the sacrificial layer is not provided; forming corresponding back holes on the substrate and the insulating layer and releasing the sacrificial layer; forming the thermal bimorph diaphragm which is warped with the first thermal bimorph layer and the second thermal bimorph layer after the sacrificial layer is released.

12 Claims, 7 Drawing Sheets

(51) Int. Cl.
*H04R 7/06* (2006.01)
*H04R 31/00* (2006.01)
*H04R 19/01* (2006.01)
*B81B 7/00* (2006.01)
*B81C 1/00* (2006.01)

(52) U.S. Cl.
CPC ........... *H04R 19/013* (2013.01); *H04R 31/00* (2013.01); *H04R 31/003* (2013.01); *B81B 2201/0257* (2013.01); *B81B 2201/032* (2013.01); *B81B 2203/0127* (2013.01); *B81B 2207/012* (2013.01); *B81C 2201/0197* (2013.01); *H04R 2201/003* (2013.01); *H04R 2307/025* (2013.01); *H04R 2307/027* (2013.01)

(58) Field of Classification Search
CPC .............. B81C 2201/0197; H04R 7/06; H04R 19/013; H04R 31/00; H04R 2201/003; H04R 2307/025
USPC ....... 381/113, 174, 175, 189, 191, 355, 360, 381/369
See application file for complete search history.

(56) References Cited

U.S. PATENT DOCUMENTS

| | | | |
|---|---|---|---|
| 2012/0013218 A1* | 1/2012 | Huang | H03H 3/0072 310/300 |
| 2013/0067909 A1* | 3/2013 | Pal | F03G 7/065 60/529 |

* cited by examiner

METHOD FOR MANUFACTURING THERMAL BIMORPH DIAPHRAGM AND MEMS SPEAKER WITH THERMAL BIMORPHS

CROSS-REFERENCE TO RELATED APPLICATIONS

The present specification is a U.S. National Stage of International Patent Application No. PCT/CN2014/085204, filed on Aug. 26, 2014, the entire contents of which are incorporated herein by reference.

FIELD OF THE INVENTION

The present invention relates to the field of acoustoelectric conversion, more specifically, to a method for manufacturing thermal bimorph diaphragm, and a MEMS speaker with thermal bimorphs.

BACKGROUND

As a common electroacoustic transducer for converting electrical signal into acoustic signal, a speaker plays an important role in sounding system. There are various kinds of speakers, by which cones or diaphragms are driven by audio electrical power to vibrate and resonate with the surrounding air to produce sound through electromagnetic induction effect, piezoelectric effect or electrostatic effect. Therefore, it is difficult to imagine how to enjoy high-quality sound effect without these useful speakers.

On one hand, the prior art speakers are mostly manufactured by wafer process and magnet integration, which makes the manufacturing process of the speaker extremely complicated. Besides, the connecting means for connecting the components of the speaker are mostly made of fragile materials which, however, are unable to bear relatively large deformation, thereby having a negative effect on the quality and service life of the speaker.

On the other hand, most of the prior art speakers are a miniaturized digital speaker which requires a complicated high voltage integrated circuit (micro-electronic) to drive itself, and the quality and service life of the speaker is strongly influenced by the impact to the diaphragm from the digital switch of the speaker.

Therefore, the prior art speaker has the following problems:

1. In the market of consumer electronics, the share of conventional miniaturized speaker is decreasing due to limitations of technology and cost and constraints of the application in the specific end products.
2. The advantage is not significant enough when applying the technology of micro-electronics to the speaker.
3. The complicated wafer process drives the fabrication cost high.

SUMMARY

In view of the above problems, it is an objective of the present invention to provide a method for manufacturing thermal bimorph diaphragm and a MEMS speaker with thermal bimorphs to solve the problems of high production cost, complicated wafer process and limitations on sound performance improvements of a speaker.

In one aspect, the present invention provides a method for manufacturing thermal bimorph diaphragm comprising:

thermally oxidizing a substrate to obtain an insulating layer thereon and providing a metal layer on the insulating layer;

providing a sacrificial layer on the metal layer;

providing a first thermal bimorph layer on the sacrificial layer;

providing a second thermal bimorph layer on the first thermal bimorph layer;

providing a metal connecting layer at the positions on the metal layer where the sacrificial layer is not provided, wherein the metal connecting layer serves as a connection point of the thermal bimorph diaphragm;

forming corresponding back holes on the substrate and the insulating layer and releasing the sacrificial layer; and forming the thermal bimorph diaphragm which is warped with the first thermal bimorph layer and the second thermal bimorph layer after the sacrificial layer is released.

Further, it is preferable that at least two thermal bimorph diaphragms are connected to each other by their connection points to form a thermal bimorph diaphragm array.

As an option, a continuous thin film is coated on top of the thermal bimorph diaphragm array before releasing the sacrificial layer, so that after the sacrificial layer is released, all the warped thermal bimorph diaphragms are mechanically connected. This may help preventing sound leakage between front and back chambers. Thin film may be one selected from a group of polymers, plastics, dielectrics, and the like.

In another aspect, the present invention provides a MEMS speaker with thermal bimorphs comprising a MEMS acoustoelectric chip and a PCB substrate, wherein, the MEMS acoustoelectric chip comprises a thermal bimorph diaphragm array, wherein the thermal bimorph diaphragm array is manufactured through the above method, and at least one side of the MEMS acoustoelectric chip is metalized, and the one metalized side of the MEMS acoustoelectric chip is connected with the PCB substrate.

Further, it is preferable that the PCB substrate is provided with metal paths thereon.

Further, it is preferable that the one metalized side of the MEMS acoustoelectric chip is flip-chip mounted on the metal paths of the PCB substrate. A gap between the flip-chip mounted MEMS acoustoelectric chip and the PCB substrate is filled with an edge-fill.

Further, it is preferable that the one metalized side of the MEMS acoustoelectric chip is connected with the metal paths of the PCB substrate by lead wires; and the side not metalized of the MEMS acoustoelectric chip is connected with the PCB substrate through die-attaching.

Further, it is preferable that the MEMS speaker with thermal bimorphs further comprises a drive device and a sealing cover.

Further, it is preferable that the drive device is an IC driver and/or a flip-chip.

Further, it is preferable that the sealing cover and the PCB substrate are enclosed to form a back chamber, and an opening for transmitting sounds of the MEMS speaker is provided at a position on the PCB substrate corresponding to the thermal bimorph diaphragm array.

Further, it is preferable that the sealing cover and the PCB substrate are enclosed to form a front chamber, and an opening for transmitting sounds of the MEMS speaker is provided at a front portion or a lateral side portion of the sealing cover.

As can be seen from the above technical solution, the method for manufacturing thermal bimorph diaphragm and the MEMS speaker with thermal bimorphs according to the present invention adopt a diaphragm with driving force made from different materials, thereby not only lowering production cost of the speaker, but also improving sound performance of the speaker. As the thermal bimorph diaphragm is made of different diaphragm materials with different coefficients of thermal expansion and thermal stability, the speaker has better sound performance.

In order to achieve the above and related objectives, one or more aspects of the present invention comprise the features detailed below and set forth particularly in the claims. Some exemplary aspects of the present invention are described in details by the description below and the accompanying drawings. However, these aspects only present some implementations of various implementations of the present invention. In addition, the present invention is intended to include all these aspects and their equivalents.

BRIEF DESCRIPTION OF THE DRAWINGS

By referring to the descriptions in connection with the accompanying drawings and the claims, and with a full understanding of the present invention, other purposes and results of the present invention will be more clearly and easily understood. In the drawings:

Figure 1:
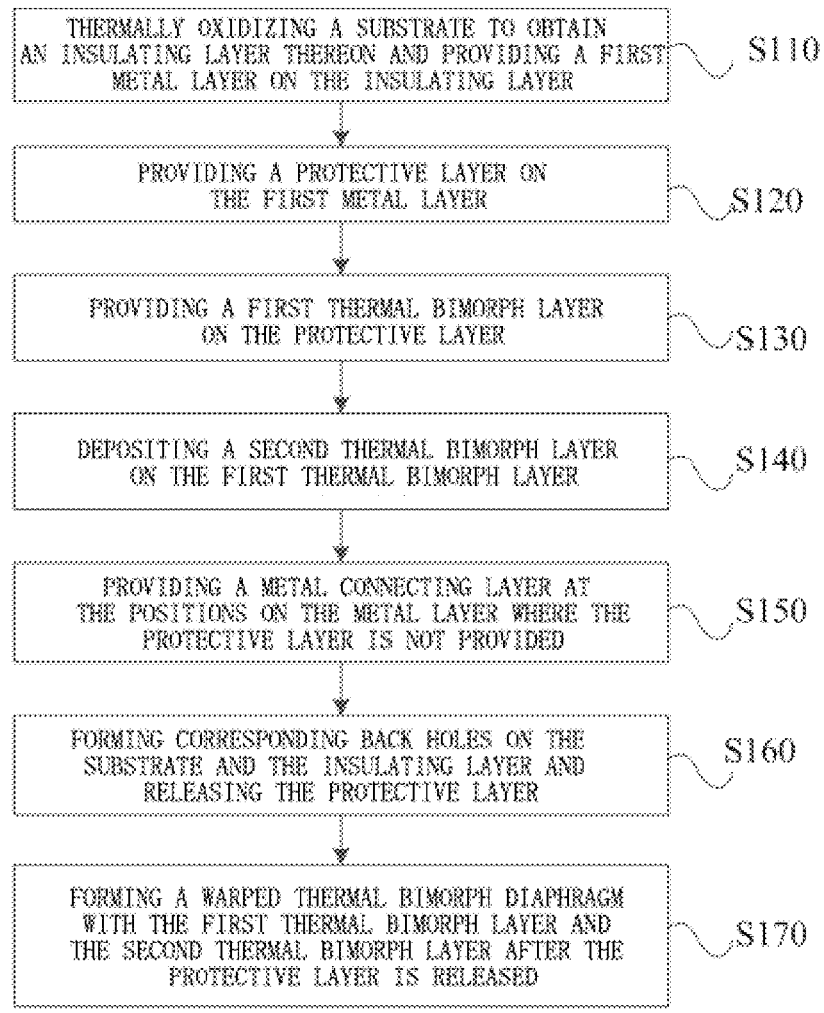
FIG. 1 is a flowchart illustrating the method for manufacturing thermal bimorph diaphragm according to the embodiment of the present invention.

Wherein the reference numerals comprise: substrate 1, insulating layer 2, metal layer 3, sacrificial layer 4, first thermal bimorph layer 5, second thermal bimorph layer 6, metal connecting layer 7, thermal bimorph diaphragm array 8, Si substrate 9, PCB substrate 10, metal paths 101, drive device 11, flip-chip 111, IC driver 112, lead wire 113, sealing cover 12, opening 13 for transmitting sounds, edge-fill 14, die-attaching 15, and back hole 16.

Throughout the drawings, similar signs indicate similar or corresponding features or functions.

DETAILED DESCRIPTION OF THE EMBODIMENTS

Various specific details are set forth in the following description to comprehensively understand one or more embodiments for purpose of illustration. However, it is obvious that these embodiments can be implemented without such specific details.

Aiming at solving the abovementioned problems of high fabrication cost, complicated wafer process and concerns over driving reliability of diaphragm, the present invention provides a MEMS speaker with thermal bimorphs which can be manufactured by a simple process, thereby lowering the production cost of the speaker. As the thermal bimorph diaphragm is made of two layers of different diaphragm materials, the diaphragm has driving force per se, and these materials have different coefficients of thermal expansion, thus the thermal bimorph diaphragm vibrates in a larger extent, thereby improving the sound performance of the speaker.

Particular embodiments of the present invention are described in connection with the accompanying drawings. In the description below, for sake of conciseness and clarity, numerous process details, such as devices, conditions, parameters and the like, which are known to those skilled in the art, are omitted.

In order to explain the method for manufacturing thermal bimorph diaphragm, FIG. 1 illustrates the process of the method for manufacturing thermal bimorph diaphragm according to the present invention.

As illustrated in FIG. 1, the method for manufacturing thermal bimorph diaphragm provided by the present invention comprises:

S110: thermally oxidizing a substrate to obtain an insulating layer thereon and providing a metal layer on the insulating layer.

In the present invention, an insulating layer is obtained by thermally oxidizing a Si substrate, and it should be noted that silicon oxide formed by poly-silicon in the substrate reacting with oxidizing agent serves as the insulating layer, and then a metal layer is provided on the insulating layer of silicon oxide, and the metal layer serves as a conductor (the metallic conductor on the one metalized side of the MEMS acoustoelectric chip in the MEMS speaker) to be connected with the drive device in the MEMS speaker.

Figures 1, 2:
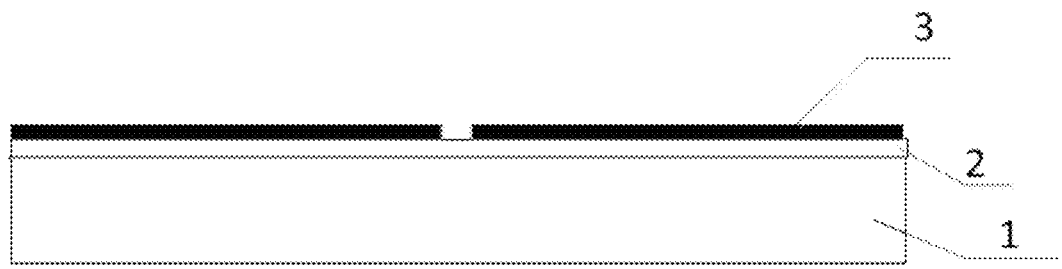
Figure 2:
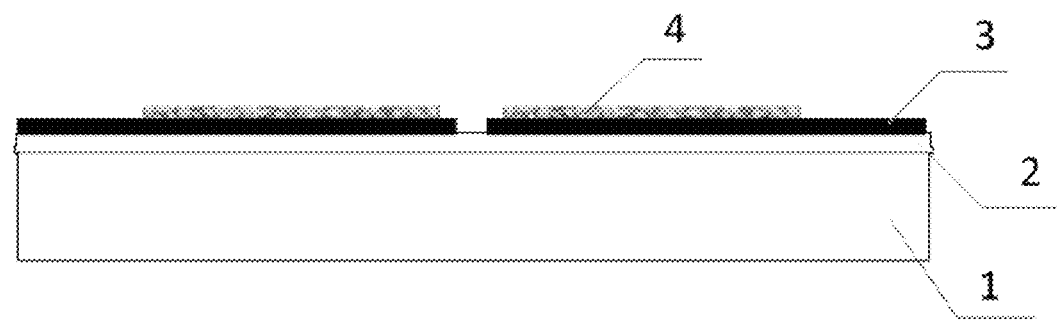
FIG. 2A is a schematic view illustrating the structure of the metal layer according to the embodiment of the present invention.
FIG. 2B is a schematic view illustrating the structure of the sacrificial layer according to the embodiment of the present invention.
FIG. 2C is a schematic view illustrating the structure of the first thermal bimorph layer according to the embodiment of the present invention.
FIG. 2D is a schematic view illustrating the structure of the second thermal bimorph layer according to the embodiment of the present invention.
FIG. 2E is a schematic view illustrating the structure of the metal connecting layer according to the embodiment of the present invention.
FIG. 2F is a schematic view illustrating etching back holes and releasing the sacrificial layer according to the embodiment of the present invention.
FIG. 2G is a schematic view illustrating the structure of the thermal bimorph according to the embodiment of the present invention.
FIG. 2H is a schematic view illustrating the structure of the thermal bimorph diaphragm array according to the embodiment of the present invention.

In order to explain the structure of the metal layer provided on the insulating layer, FIG. 2A illustrates the structure of the metal layer according to the embodiment of the present invention. As illustrated in FIG. 2A, the substrate 1 is thermal oxidized to obtain an insulating layer 2, that is, silicon oxide formed by poly-silicon in the substrate 1 reacting with oxidizing agent serves as the insulating layer 2, and then a metal layer 3 is provided on the insulating layer 2, and the metal layer 3 serves as a conductor to be connected with the drive device in the MEMS speaker.

S120: providing a sacrificial layer on the metal layer.

In order to explain the structure of the sacrificial layer provided on the metal layer, FIG. 2B illustrates the structure of the sacrificial layer according to the embodiment of the present invention. As illustrated in FIG. 2B, a sacrificial layer 4 is provided on the metal layer 3. The sacrificial layer 4 is provided in order to separate the metal layer 3 from the first thermal bimorph layer completely. However, the sacrificial layer 4 does not present in the final structure of the thermal bimorph diaphragm, but only presents in the process of manufacturing thermal bimorph diaphragm, and is an indispensable part in the manufacturing process. The metal layer 3 is separated from the first thermal bimorph layer by the sacrificial layer 4 in order to warp under the pre-stress of the thermal bimorph diaphragm, thereby obtaining greater deflection.

S130: providing a first thermal bimorph layer on the sacrificial layer.

Specifically, in the present invention, the thermal bimorph is high thermally-conductive bimorph materials, which have high thermal conductivity. Therefore, the first thermal bimorph layer is formed of metal, such as, aluminum, W—Ti alloy and the like. In the present invention, the first thermal bimorph layer is the material for manufacturing the first layer of the thermal bimorph diaphragm.

In order to explain the structure of the first thermal bimorph layer provided on the sacrificial layer, FIG. 2C illustrates the structure of the first thermal bimorph layer according to the embodiment of the present invention. As illustrated in FIG. 2C, the first thermal bimorph layer 5 is provided on the sacrificial layer 4. As the thermal bimorph is made from high thermally-conductive bimorph materials, the first thermal bimorph layer 5 is made of metal, such as, aluminum, W—Ti alloy and the like. That is, an aluminium film or W—Ti film which serves as the first thermal bimorph layer 5 is provided on the sacrificial layer 4.

S140: providing a second thermal bimorph layer on the first thermal bimorph layer.

Specifically, in the present invention, the thermal bimorph is high thermally-conductive bimorph materials which have high thermal conductivity. The second thermal bimorph layer is made of semiconductor material, such as, silicon nitride and the like. In the present invention, a silicon nitride film which serves as the second layer of the thermal bimorph diaphragm is provided on the first thermal bimorph layer.

In order to explain the structure of the second thermal bimorph layer provided on the first thermal bimorph layer, FIG. 2D illustrates the structure of the second thermal bimorph layer according to the embodiment of the present invention. As illustrated in FIG. 2D, the second thermal bimorph layer 6 is provided on the first thermal bimorph layer 5. As the thermal bimorph is made of high thermally-conductive bimorph materials, in an embodiment of the present invention, the second thermal bimorph layer 6 is made of silicon nitride, i.e., a silicon nitride film is provided on the first thermal bimorph layer 5, and the silicon nitride film serves as the second thermal bimorph layer 6.

It is noted that, in the present invention, the material of the first and second thermal bimorph layers may be selected according to the specific requirements.

S150: providing a metal connecting layer at the positions on the metal layer where the sacrificial layer is not provided, wherein the metal connecting layer serves as a connection point of the thermal bimorph diaphragm.

After the second thermal bimorph layer is provided, a metal connecting layer is provided at the positions on the sacrificial layer where the metal layer is not provided, and it is noted that the metal connecting layer serves as a connection point of the thermal bimorph diaphragm array.

In order to explain the structure of the metal connecting layer, FIG. 2E illustrates the structure of the metal connecting layer according to the embodiment of the present invention. As illustrated in FIG. 2E, a metal connecting layer 7 is provided at the positions on the sacrificial layer 3 where the metal layer 4 is not provided, and the metal connecting layer 7 serves as a connection point of the thermal bimorph diaphragm.

The metal connecting layer 7 serves as a connection point of the thermal bimorph diaphragm, and the thermal bimorph diaphragms are connected by the metal connecting layer 7 of the thermal bimorph diaphragm between each other. The thermal bimorph diaphragm array can be considered as a larger integral diaphragm for the MEMS acoustoelectric chip of the MEMS speaker.

S160: forming corresponding back holes on the substrate and the insulating layer and removing the sacrificial layer.

By etching, the corresponding back holes are formed on the substrate and the insulating layer and the sacrificial layer is released, i.e., the sacrificial layer is cleared out completely, and a gap is formed between the metal layer and the first thermal bimorph layer.

In order to explain the structure of the back holes and the structure after the sacrificial layer is released, FIG. 2F illustrates the etched back holes and the structure after the sacrificial layer is released according to the embodiment of the present invention. As illustrated in FIG. 2F, the back holes on the substrate 1 and the insulating layer 2 are formed by etching, and the sacrificial layer 4 is released. The sacrificial layer 4 was provided in order to separate the metal layer 3 from the first thermal bimorph layer 5.

S170: forming a warped thermal bimorph diaphragm with the first thermal bimorph layer and the second thermal bimorph layer after the sacrificial layer is released.

Specifically, after the sacrificial layer is released, the first thermal bimorph layer and the second thermal bimorph layer are warped to form a thermal bimorph diaphragm due to the pre-stress in the first thermal bimorph layer and the second thermal bimorph layer.

In order to explain the warped structure of the thermal bimorph, FIG. 2G illustrates the structure of the thermal bimorph according to the embodiment of the present invention. As illustrated in FIG. 2Q since there is no binding force between the first thermal bimorph layer 5 and the metal layer 3, after the sacrificial layer is released, the first thermal bimorph layer 5 and the second thermal bimorph layer 6 are warped to form a upward deflected thermal bimorph diaphragm due to the pre-stress in the first thermal bimorph layer 5 and the second thermal bimorph layer 6.

As an option, a continuous thin film is coated on top of the bimorph diaphragm array before releasing the sacrificial layer, so that after the sacrificial layer is released, all the warped bimorph diaphragms are mechanically connected. This may help preventing sound leakage between front and back chambers. Thin film may be one selected from the group of polymers, plastics, dielectrics, etc.

S180: connecting at least two thermal bimorph diaphragms to each other by their connection points to form a thermal bimorph diaphragm array.

In order to explain the structure of the thermal bimorph diaphragm array, FIG. 2H illustrates the structure of the thermal bimorph diaphragm array according to the embodiment of the present invention. As illustrated in FIG. 2H, one thermal bimorph diaphragm array is formed of four thermal bimorph diaphragms. Generally speaking, the thermal bimorph diaphragm array can be connected in parallel or in series or in both parallel and series based on the specific requirements of the speaker.

The diaphragm and the diaphragm array formed in the FIG. 2A to 2H above is a specific embodiment of the present invention. In the present invention, however, there may be other diaphragms and diaphragm array as desired. In order to explain the structures of other diaphragms and diaphragm array, FIG. 3A and FIG. 3B illustrate the structures of the typical thermal bimorph diaphragms and the typical thermal bimorph diaphragm array according to the embodiments of the present invention respectively.

Figures 2, 3:
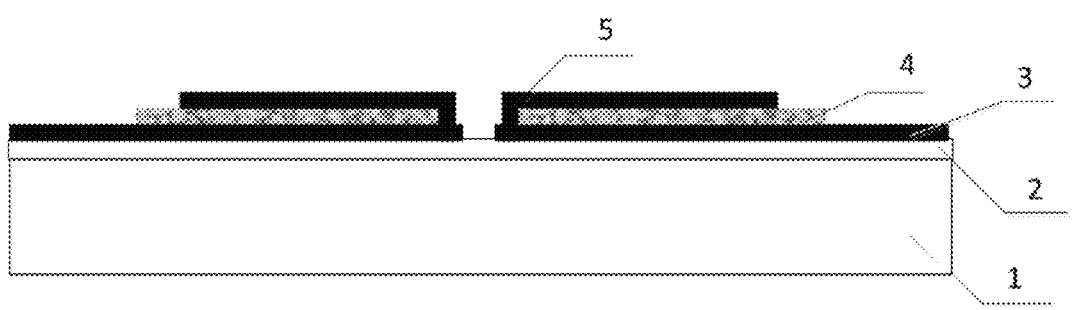
FIG. 3A is a schematic view illustrating the structure of the typical thermal bimorph diaphragm according to the embodiment of the present invention.
FIG. 3B is a schematic view illustrating the structure of the typical thermal bimorph diaphragm array according to the embodiment of the present invention.

As illustrated in FIG. 3A and FIG. 3B, the typical thermal bimorph diaphragm is of a rectangular structure, and specifically comprises a rectangular metal layer 3, a rectangular sacrificial layer 4, a loop-shaped first thermal bimorph layer 5 and a loop-shaped second thermal bimorph layer 6 and a metal connecting layer 7. The process details for forming each layer is substantially the same to the above method for manufacturing diaphragm, which is not described in details here.

As illustrated in FIG. 3B, the typical thermal bimorph diaphragm array is of a 3×3 array, with each thermal bimorph diaphragm being connected to each other by the metal connecting layer. The size of the diaphragm array is set based on actual requirement for the MEMS speaker, i.e., if the MEMS speaker is required to have larger power, more diaphragms can be used and connected to form a diaphragm array, and if the MEMS speaker is required to have smaller power, less diaphragms can be used and connected to form a diaphragm array.

The MEMS speaker with thermal bimorphs provided by the present invention comprises a MEMS acoustoelectric chip and a PCB substrate. The MEMS acoustoelectric chip comprises a thermal bimorph diaphragm array which is manufactured by the above method, and at least one side of the MEMS acoustoelectric chip is metalized, and the one metalized side of the MEMS acoustoelectric chip is connected with the PCB substrate, meanwhile the PCB substrate is provided with metal paths thereon.

Figures 2, 3, 4:
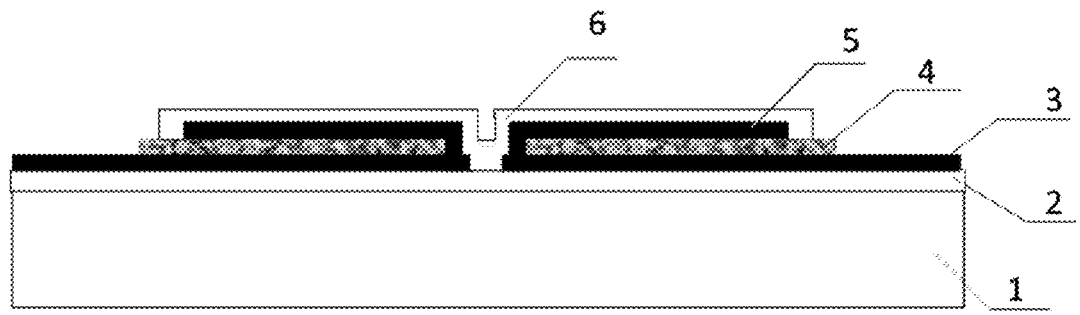
FIG. 4 is a schematic view illustrating example 1 of the structure of the MEMS speaker with thermal bimorphs according to the embodiment of the present invention.

In order to explain the structure of the MEMS speaker with thermal bimorphs, FIG. 4 illustrates example 1 of the structure of the MEMS speaker with thermal bimorphs according to the embodiment of the present invention.

As illustrated in FIG. 4, the MEMS speaker with thermal bimorphs comprises a MEMS acoustoelectric chip and a PCB substrate 10, a drive device 11 and a sealing cover 12. The MEMS acoustoelectric chip comprises a thermal bimorph diaphragm array 8 and a Si substrate 9, wherein the thermal bimorph diaphragm array 8 is manufactured by the method above.

The thermal bimorph diaphragm array 8 is made of bimorph which has high thermal conductivity. That is, the thermal bimorph diaphragm array 8 is made of two different diaphragm layers and each diaphragm layer is made of a different material. Generally speaking, the material of the first diaphragm layer of the thermal bimorph diaphragm array 8 may be metal or metal alloy, and the material of the second diaphragm layer of the thermal bimorph diaphragm array 8 may be nonmetal.

With the help of the pre-stress, the thermal bimorph diaphragm array 8 with driving force per se has a larger amplitude (the diaphragms vibrates in a larger extent), thus electrical resistance caused by air damping is reduced by the thermal bimorph diaphragm array 8 with driving force per se, thereby improving the sound performance of the MEMS speaker. That is, the thermal bimorph diaphragm array 8 with driving force per se may also have relatively a large amplitude under a low voltage, thereby improving the sound performance of the speaker.

Due to the bimorph material having high thermal conductivity of the thermal bimorph diaphragm array 8 and its smaller size (typical size is 20 um wide and 50 um long), the diaphragm of the thermal bimorph structure has a thermal stability time. Thus, the diaphragm of the thermal bimorph structure of the MEMS speaker also can still maintain good sound performance during long operating time or under higher temperature.

Additionally, the two diaphragm layers of the thermal bimorph diaphragm array 8 adopt two materials with relatively a large difference of coefficients of thermal expansion (CTE). By utilizing the thermal bimorph diaphragm array 8 with a large difference of thermal expansion, the diaphragm of the speaker can be enabled to vibrate in a larger extent under a certain temperature, thus maintaining good sound performance.

At least one side of the MEMS acoustoelectric chip is metalized, the one metalized side of the MEMS acoustoelectric chip is connected with the PCB substrate 10, and the PCB substrate 10 is provided with metal paths 101 thereon. It is noted that the one metalized side of the MEMS acoustoelectric chip is flip-chip mounted on the metal paths 101 of the PCB substrate.

Wherein, it is noted that the one metalized side of the MEMS acoustoelectric chip serves as the metal layer provided on the insulating layer in the above method for manufacturing diaphragm, and the metal layer is provided on the insulating layer by evaporation.

Additionally, the gap between the flip-chip mounted MEMS acoustoelectric chip and the PCB substrate 10 is filled with an edge-fill. That is, the gap between the flip-chip mounted MEMS acoustoelectric chip and the PCB substrate 10 is completely filled with an edge-fill 14, thereby achieving better sealing and avoiding air leakage of the sealed chamber of the speaker.

The drive device 11 of the MEMS speaker with thermal bimorphs is an IC driver 112 and/or a flip-chip 111. When the drive device 11 is an IC driver 112, lead wires 113 are further required to connect the IC driver 112 with the metal paths 101, while the metal paths 101 are directly connected to the one metalized side of the flip-chip mounted MEMS acoustoelectric chip, i.e., the one metalized side of the flip-chip mounted MEMS acoustoelectric chip is provided on the PCB substrate.

The sealing cover 12 and the PCB substrate 10 are enclosed to form a back chamber, and an opening 13 for transmitting sounds of the MEMS speaker is provided at the position on the PCB substrate corresponding to the thermal bimorph diaphragm array 8.

Figures 2, 3, 4, 5:
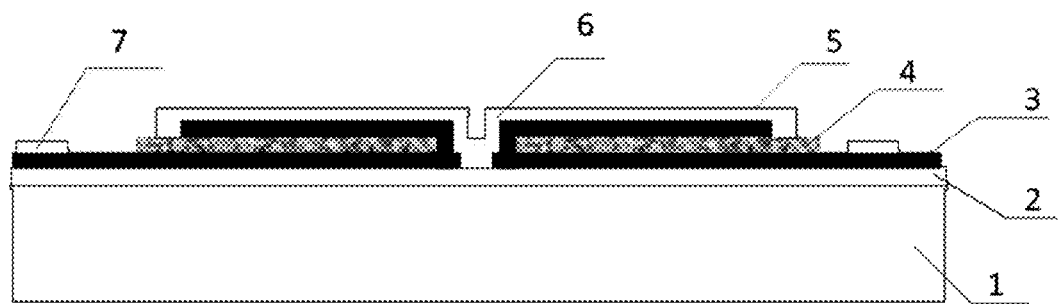
FIG. 5 is a schematic view illustrating example 2 of the structure of the MEMS speaker with thermal bimorphs according to the embodiment of the present invention.
Figures 2, 3, 4, 5, 6:
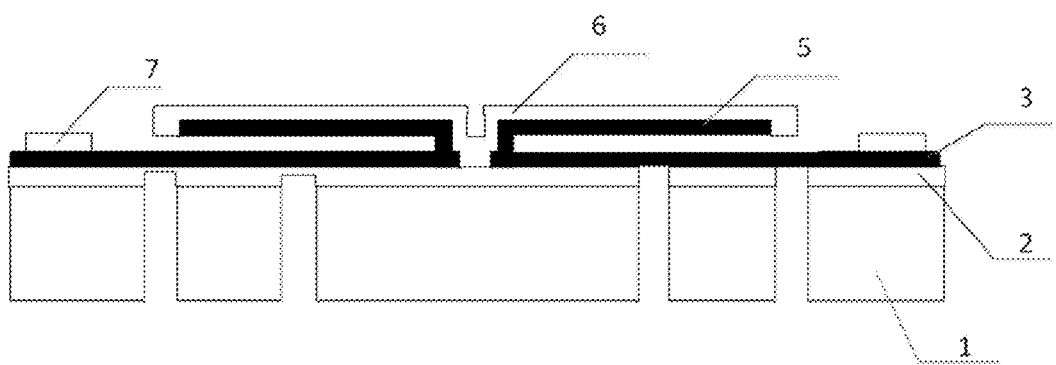
FIG. 6 is a schematic view illustrating example 3 of the structure of the MEMS speaker with thermal bimorphs according to the embodiment of the present invention.
Figures 2, 3, 4, 5, 6, 7:
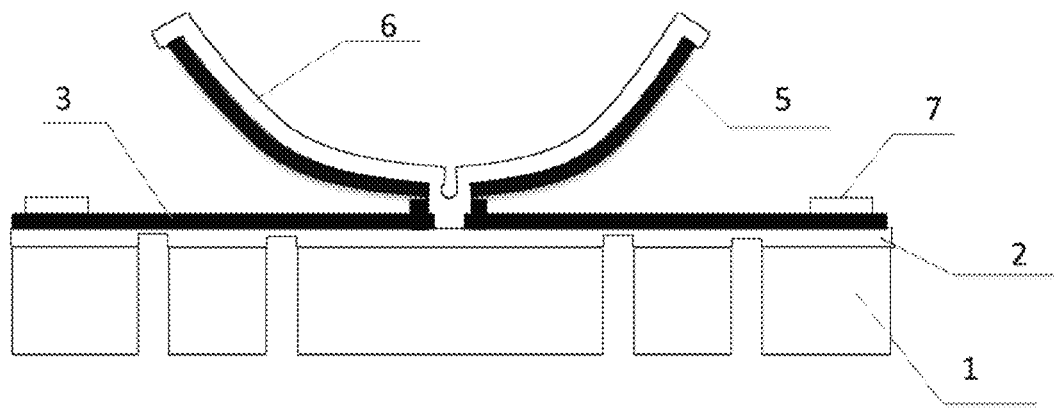
Figures 2, 3, 4, 5, 6, 7, 8:
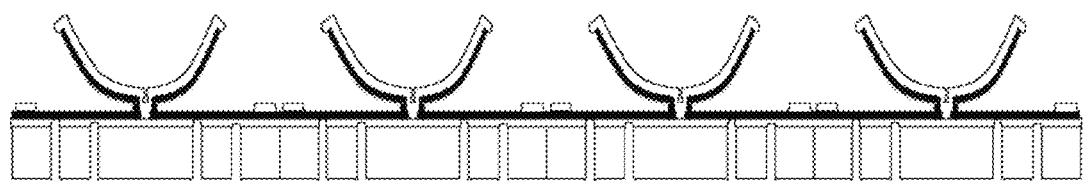
Figures 1, 3:
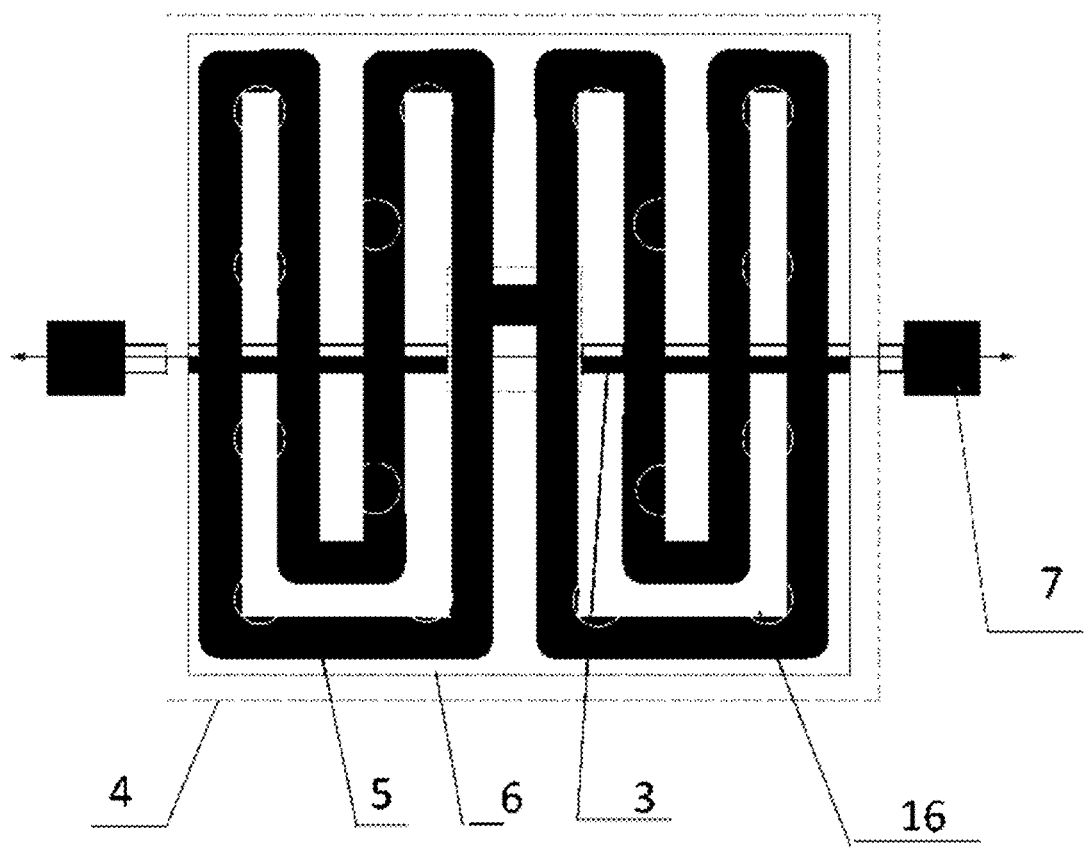
Figures 2, 3:
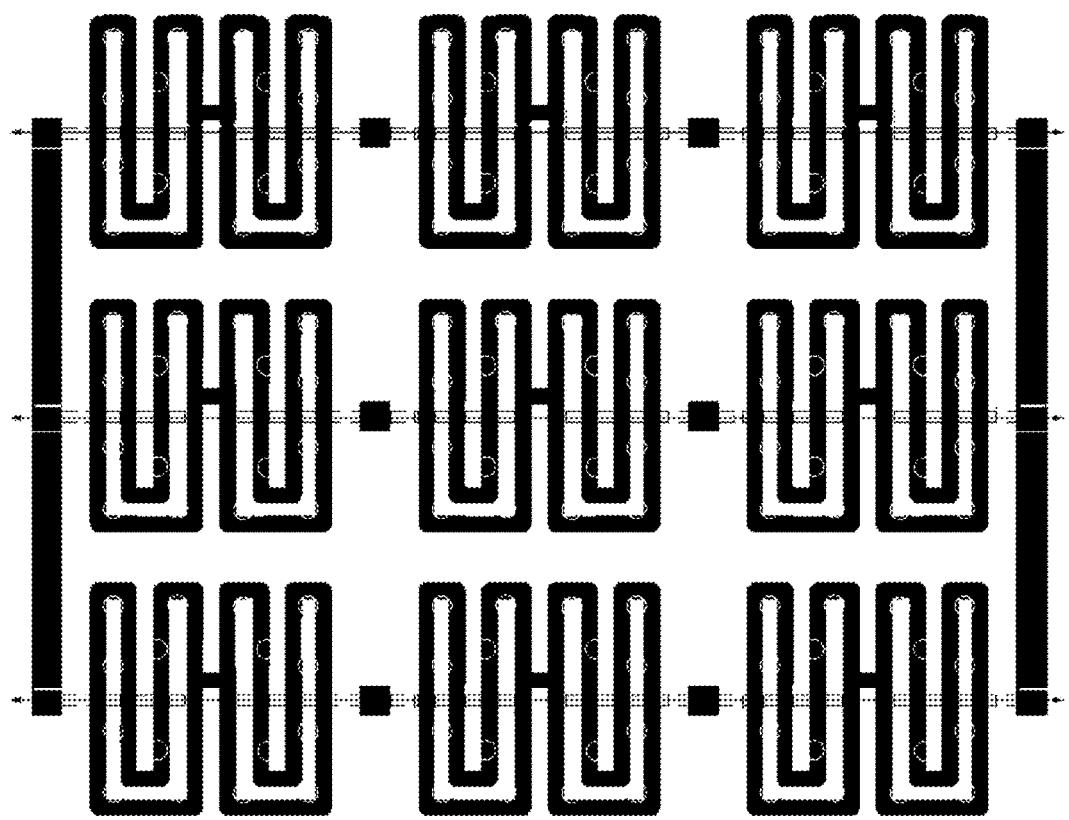
Figure 4:
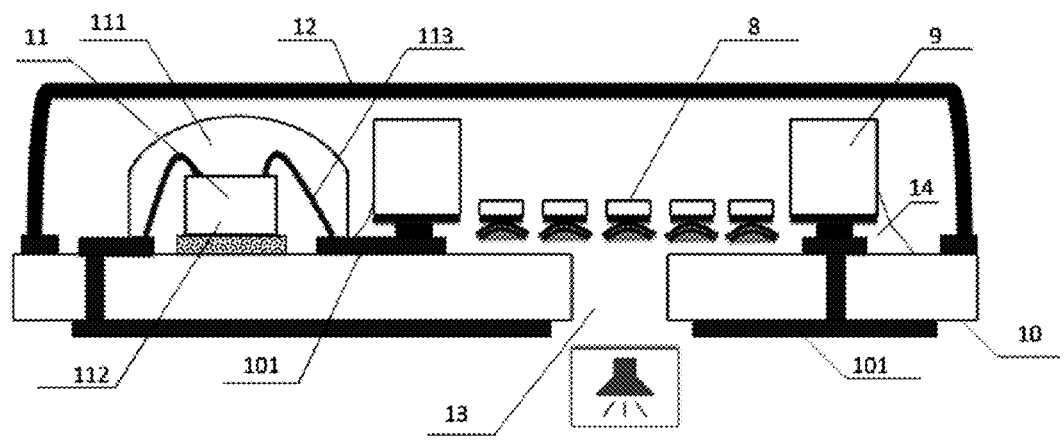
Figure 5:
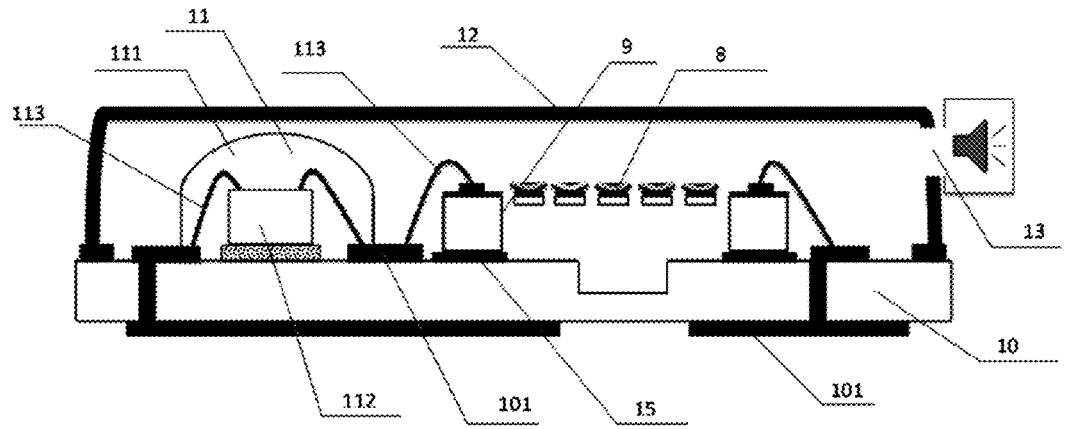
Figure 6:
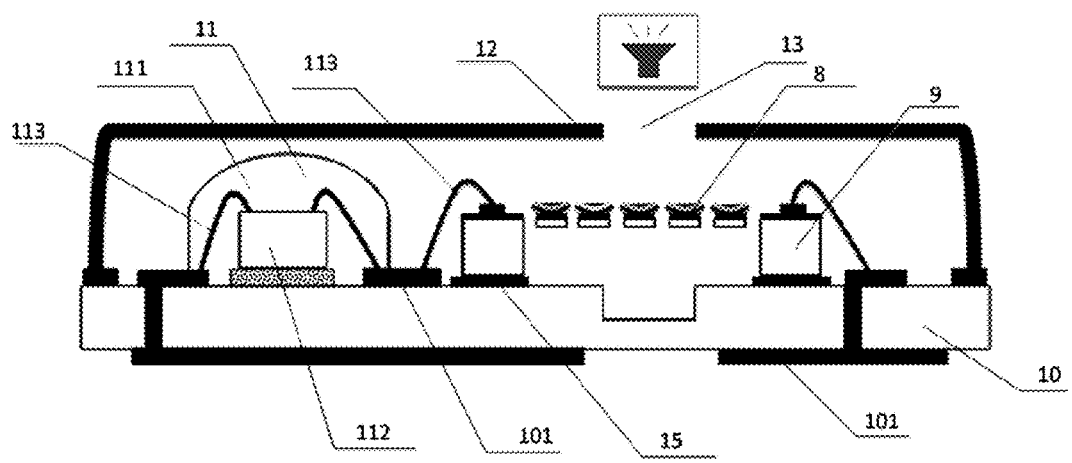

In order to explain the structure of the MEMS speaker with thermal bimorphs, FIG. 5 and FIG. 6 illustrate examples 2 and 3 of the structure of the MEMS speaker with thermal bimorphs according to the embodiments of the present invention, respectively.

As illustrated in FIG. 5 and FIG. 6, the MEMS speaker with thermal bimorphs comprises a MEMS acoustoelectric chip and a PCB substrate 10, a drive device 11 and a sealing cover 12. The MEMS acoustoelectric chip comprises a thermal bimorph diaphragm array 8 and a Si substrate 9, where the thermal bimorph diaphragm array 8 is manufactured by the method above.

The thermal bimorph diaphragm array 8 is made of bimorph materials which have high thermal conductivity. That is, the thermal bimorph diaphragm array 8 is made of two different diaphragm layers and each diaphragm layer is made of a different material. Generally speaking, the material of the first diaphragm layer of the thermal bimorph diaphragm array 8 may be metal or metal alloy, and the material of the second diaphragm layer of the thermal bimorph diaphragm array 8 may be nonmetal.

With the help of the pre-stress, the thermal bimorph diaphragm array 8 with driving force per se has a larger amplitude (the diaphragm vibrates in a larger extent), thus the electrical resistance caused by air damping is reduced by the thermal bimorph diaphragm array 8 with driving force per se, thereby enabling the MEMS speaker to have a better sound performance. That is, the thermal bimorph diaphragm array 8 with driving force per se may also have relatively a large amplitude under a low voltage, thereby improving the sound performance of the speaker.

Due to the bimorph material having high thermal conductivity and its smaller size (typical size is 20 um wide and 50 um long) of the thermal bimorph diaphragm array 8, the diaphragm of the thermal bimorph structure has a thermal stability time. Thus, the MEMS speaker having the diaphragm of the thermal bimorph structure also can maintain good sound performance during long operating time or under higher temperature.

Additionally, the two diaphragm layers of the thermal bimorph diaphragm array 8 adopt two materials with relatively a large difference of coefficients of thermal expansion. By utilizing the thermal bimorph diaphragm array 8 with a large difference of thermal expansion, the diaphragm of the speaker can be enabled to vibrate in a larger extent under a certain temperature, thereby maintaining good sound performance.

The one metalized side of the MEMS acoustoelectric chip is connected with the metal paths 101 of the PCB substrate by lead wires 113. The side not metalized of the MEMS acoustoelectric chip is connected with the PCB substrate 10 through die-attaching. The MEMS acoustoelectric chip is normally provided on the PCB substrate 10, rather than flip-chip mounted on the PCB substrate 10.

The drive device 11 of the MEMS speaker with thermal bimorphs is an IC driver 112 and/or a flip-chip 111. When the drive device 11 is an IC driver 112, the lead wires 113 are further required to connect the IC driver 112 with the metal paths 101.

In the present embodiment, the one metalized side of the MEMS acoustoelectric chip is connected with the metal paths 101 on the PCB substrate by the lead wires 113 as well, i.e., both the MEMS acoustoelectric chip and the IC driver 112 are connected by lead wires 113.

The sealing cover 12 and the PCB substrate 10 are enclosed to form a front chamber, and an opening 13 for transmitting sounds of the MEMS speaker is provided at the front portion or the lateral side portion of the sealing cover. In the example illustrated in FIG. 5, the opening 13 for transmitting sounds is located on a lateral side portion of the sealing cover 12, while in the example illustrated in FIG. 6, the opening 13 is located at the front portion of the sealing cover 12.

Furthermore, it is noted that the method and the principle of the present invention is applicable to not only a MEMS speaker, but also a MEMS receiver.

As can be seen from the above embodiments, the method for manufacturing thermal bimorph diaphragm and the MEMS speaker with thermal bimorphs provided by the present invention adopt diaphragms with driving force per se made from different materials, thereby not only lowering production cost of the speaker, but also improving sound performance of the speaker. As the thermal bimorph diaphragm is made of different diaphragm materials with different coefficients of thermal expansion and thermal stabilities, the speaker has better sound performance.

The method for manufacturing thermal bimorph diaphragm and the thermal bimorph MEMS speaker provided by the present invention are described with reference to the figures in a exemplified way. However, it should be understood by those skilled in the art that various improvements can be made to the method for manufacturing thermal bimorph diaphragm and the MEMS speaker with thermal bimorphs provided by the present invention as described above without depart from the principles and spirits of the present invention. Accordingly, the scope of protection of the present invention should be defined by the appended claims.

The invention claimed is:

1. A method for manufacturing a thermal bimorph diaphragm, comprising:
    thermally oxidizing a substrate to obtain an insulating layer thereon and providing a metal layer on the insulating layer;
    providing a sacrificial layer on the metal layer;
    providing a first thermal bimorph layer on the sacrificial layer;
    providing a second thermal bimorph layer on the first thermal bimorph layer;
    providing a metal connecting layer at the positions on the metal layer where the sacrificial layer is not provided, wherein the metal connecting layer serves as a connection point of the thermal bimorph diaphragm;
    forming corresponding back holes on the substrate and the insulating layer and releasing the sacrificial layer; and
    forming the thermal bimorph diaphragm which is warped with the first thermal bimorph layer and the second thermal bimorph layer after the sacrificial layer is released.

2. The method for manufacturing a thermal bimorph diaphragm of claim 1, wherein
    at least two of the thermal bimorph diaphragms are connected to each other by their connection points to form a thermal bimorph diaphragm array.

3. The method for manufacturing a thermal bimorph diaphragm of claim 2, wherein
    a continuous thin film is coated on top of the thermal bimorph diaphragm array before releasing the sacrificial layer, so that after the sacrificial layer is released, all the thermal bimorph diaphragms which are warped are mechanically connected.

4. The method for manufacturing a thermal bimorph diaphragm of claim 3, wherein
    the continuous thin film is one selected from a group of polymers, plastics, and dielectrics.

5. A MEMS speaker with thermal bimorphs comprising a MEMS acoustoelectric chip and a PCB substrate, wherein,
    the MEMS acoustoelectric chip comprises a thermal bimorph diaphragm array, wherein
    the thermal bimorph diaphragm array is manufactured by the method of claim 2, and
    at least one side of the MEMS acoustoelectric chip is metalized, and the metalized side of the MEMS acoustoelectric chip is connected with the PCB substrate.

6. The MEMS speaker with thermal bimorphs of claim 5, wherein,
    a metal path is provided on the PCB substrate.

7. The MEMS speaker with thermal bimorphs of claim 6, wherein, one metalized side of the MEMS acoustoelectric chip is flip-chip mounted on the metal path of the PCB substrate; and
a gap between the flip-chip mounted MEMS acoustoelectric chip and the PCB substrate is filled with an edge-fill process.

8. The MEMS speaker with thermal bimorphs of claim 6, wherein,
one metalized side of the MEMS acoustoelectric chip is connected with the metal path of the PCB substrate by a lead wire; and
the side of the MEMS acoustoelectric chip that is not metalized is connected with the PCB substrate through die-attaching.

9. The MEMS speaker with thermal bimorphs of claim 6, wherein,
the MEMS speaker further comprises a drive device and a sealing cover.

10. The MEMS speaker with thermal bimorphs of claim 9, wherein,
the drive device is an IC driver and/or a flip-chip.

11. The MEMS speaker with thermal bimorphs of claim 10, wherein,
the sealing cover and the PCB substrate are enclosed to form a back chamber, and an opening for transmitting sounds of the MEMS speaker is provided at a position on the PCB substrate corresponding to the thermal bimorph diaphragm array.

12. The MEMS speaker with thermal bimorphs of claim 10, wherein,
the sealing cover and the PCB substrate are enclosed to form a front chamber, and an opening for transmitting sounds of the MEMS speaker is provided at a front portion or a lateral side portion of the sealing cover.

* * * * *